(12) United States Patent
Taguchi

(10) Patent No.: US 7,098,698 B2
(45) Date of Patent: Aug. 29, 2006

(54) SEMICONDUCTOR INTEGRATED CIRCUIT DEVICE AND SENSE AMPLIFIER OF MEMORY

(75) Inventor: Kazuo Taguchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 16 days.

(21) Appl. No.: 10/916,611

(22) Filed: Aug. 12, 2004

(65) Prior Publication Data

US 2005/0082612 A1    Apr. 21, 2005

(30) Foreign Application Priority Data

Aug. 28, 2003  (JP)  ............................. 2003-304567
Sep. 19, 2003  (JP)  ............................. 2003-327993

(51) Int. Cl.
*H03F 3/45*         (2006.01)
(52) U.S. Cl. ...................................... 327/52; 365/207
(58) Field of Classification Search ............ 327/51–55
See application file for complete search history.

(56) References Cited

U.S. PATENT DOCUMENTS

| | | | |
|---|---|---|---|
| 5,241,504 A * | 8/1993 | Seevinck | 365/205 |
| 5,473,567 A * | 12/1995 | McClure | 365/208 |
| 6,239,624 B1 * | 5/2001 | Yang et al. | 327/55 |
| 6,462,585 B1 * | 10/2002 | Bernstein et al. | 327/55 |
| 6,759,875 B1 * | 7/2004 | Mano et al. | 326/95 |
| 6,791,369 B1 * | 9/2004 | Hattori | 327/52 |
| 6,812,746 B1 * | 11/2004 | Gans | 327/51 |
| 6,833,737 B1 * | 12/2004 | Aipperspach | 327/55 |

FOREIGN PATENT DOCUMENTS

JP     A 8-125034     5/1996

* cited by examiner

*Primary Examiner*—Long Nguyen
*Assistant Examiner*—Ryan Jager
(74) *Attorney, Agent, or Firm*—Oliff & Berridge, PLC

(57) ABSTRACT

To provide a semiconductor integrated circuit device and a sense amplifier in a memory in which a transistor element whose body potential is variable is built in an appropriate location and which can produce high speed operation with a layout advantage, an SOI transistor integrated circuit, each source of p-channel MOS transistor Qp1 and Qp2 is given a high potential level Vdd, for example, a supply-power potential, and respective body potentials are set as variable potentials corresponding to mutually inverse signal inputs Vin and Bvin, and a control signal CS is given to each gate. Also, each source and body of n-channel MOS transistor Qn1 and Qn2 are given a low potential level Vsa, for example, an earth potential, the signal inputs Vin and Bvin are supplied to respective gates. A connection node of these drains of the transistors Qp1 and Qn1 is connected to a signal output section Vout. Also, a connection node of the drains of the transistors Qp2 and Qn2 is connected to a signal output section BVout.

14 Claims, 1 Drawing Sheet

SEMICONDUCTOR INTEGRATED CIRCUIT DEVICE AND SENSE AMPLIFIER OF MEMORY

BACKGROUND OF THE INVENTION

1. Field of Invention

This invention relates to a semiconductor integrated circuit having a signal inverting circuit formed on a SOI (Silicon On Insulator) substrate and a sense amplifier of a memory.

2. Description of Related Art

The related art discloses a countermeasure in which SOI (Silicon On Insulator) technology is introduced to a semiconductor memory circuit to provide for high speed and high integration. A memory cell and various circuits are constituted by MOS transistors formed on a SOI substrate, and a body potential is partly or wholly fixed. This provides a circuit configuration that satisfies multiple requirements, such as priority for countermeasures for layout reduction and priority for operating performance. See Japanese Patent Unexamined Patent Publication Application No. 8-125034.

SUMMARY OF THE INVENTION

To stabilize operation, a configuration, such as to fix a body potential is effective, whereas it may cause circuit wiring to be complicated and increase the number of transistors. A circuit handling an inverted output of a signal and amplification by an MOS circuit element formed on the SOI substrate has an insufficient circuit configuration to enhance current drive capacity, thus calling for some ingenuity.

An exemplary aspect of the invention addresses the above-mentioned and/or other circumstances. An exemplary aspect of this invention provides a semiconductor integrated circuit device and a sense amplifier of a memory capable of performing high speed operation advantageously in terms of layout by incorporating a body-potential varying transistor element in a proper position.

A semiconductor integrated circuit device according to an exemplary aspect of this invention is a SOI transistor integrated circuit device having a single crystal of silicon formed on an insulating film as a body, including: a p-channel MOS transistor, a first potential being given to a source, a body potential being set as a variable potential corresponding to a signal input, and a control signal being given to a gate; an n-channel MOS transistor formed, a second potential being given to the source, and the signal input being supplied to the gate; and a signal output section being connected to a connection node between drains of the p-channel MOS transistor and the n-channel MOS transistor.

An exemplary embodiment of a semiconductor integrated circuit device according to this invention is a SIO transistor integrated circuit device having a single crystal of silicon formed on an insulating film as a body, including: a first and a second p-channel MOS transistor, a second potential being given to each source, a control signal being given to each gate, and respective body potentials being set as a variable potential corresponding to a mutually inverse signal input; a first and a second n-channel MOS transistor, a second potential being given to each source, and the mutually inverse control signal being supplied to each gate; a first signal output section connected to a connection node between drains of the first p-channel MOS transistor and the first n-channel MOS transistor; and a second signal output section connected to a connection node between drains of the second p-channel MOS transistor and the second n-channel MOS transistor.

According to the respective semiconductor integrated circuit devices of an exemplary aspect of this invention, operation is such that when the n-channel MOS transistor is off, capacity of the p-channel MOS transistor rises, and a rise-up speed of the signal output increases.

According to a semiconductor integrated circuit device of an exemplary aspect of this invention, the first and the second p-channel MOS transistor may include a control signal that turns off at standby. Thus, it is possible to hold down power consumption.

Further, according to a semiconductor integrated circuit device of an exemplary aspect of this invention, bodies and sources of the first and second n-channel MOS transistor are characterized by being put on the same potential. A body potential on the n-channel MOS transistor side is fixed and operational stability is secured.

Also, according to a semiconductor integrated circuit device of an exemplary aspect of this invention, the bodies and sources of the first and the second n-channel MOS transistor are characterized by being connected to a constant current supply, thus contributing to further stability of high-speed operation and low power consumption.

A sense amplifier of a memory according to an aspect of this invention is a sense amplifier of a memory having an SOI substrate including a transistor element with a single crystal of silicon formed on an insulating film as a body, including: a first p-channel MOS transistor formed on the SOI substrate, a first potential being given to a source, a control signal being given to a gate, and a body potential being set as a variable potential corresponding to a signal of a bit line; a second p-channel MOS transistor formed on the SOI substrate, the first potential being given to the source, and the body potential being set as a variable potential corresponding to a complementary signal of the bit line; a first n-channel MOS transistor formed on the SOI substrate, the second potential is given to the source, and the bit line signal being supplied to the gate; a second n-channel MOS transistor formed on the SOI substrate, the second potential being given to the source, and the complementary signal of the bit line being supplied to the gate; the first signal output section connected to the connection node between the drains of the first p-channel MOS transistor and the first n-channel MOS transistor; and the second signal output section connected to the connection node between the drains of the second p-channel MOS transistor and the second n-channel MOS transistor.

According to the sense amplifier of a memory of an exemplary aspect of this invention, an operation is such that when the n-channel MOS transistor is off, capacity of the p-channel MOS transistor rises, and a rise-up speed of the signal output increases.

According to the sense amplifier of a memory of an exemplary aspect of this invention, the first and second p-channel MOS transistor include a control signal that turns off at standby. Thus it is possible to hold down power consumption.

Further, according to the sense amplifier of a memory of an exemplary embodiment of this invention, the bodies and sources of the first and the second n-channel MOS transistor are characterized by being put on the same potential. The body potential on the n-channel MOS transistor side is fixed and operating stability is secured.

Still further, according to the sense amplifier in a memory of an exemplary embodiment of this invention, the bodies and sources of the first and second n-channel MOS transistor are characterized by being connected to a constant current supply, thereby contributing to further stability of high-speed operation and low power consumption.

DETAILED DESCRIPTION OF EXEMPLARY EMBODIMENTS

Figure 1:
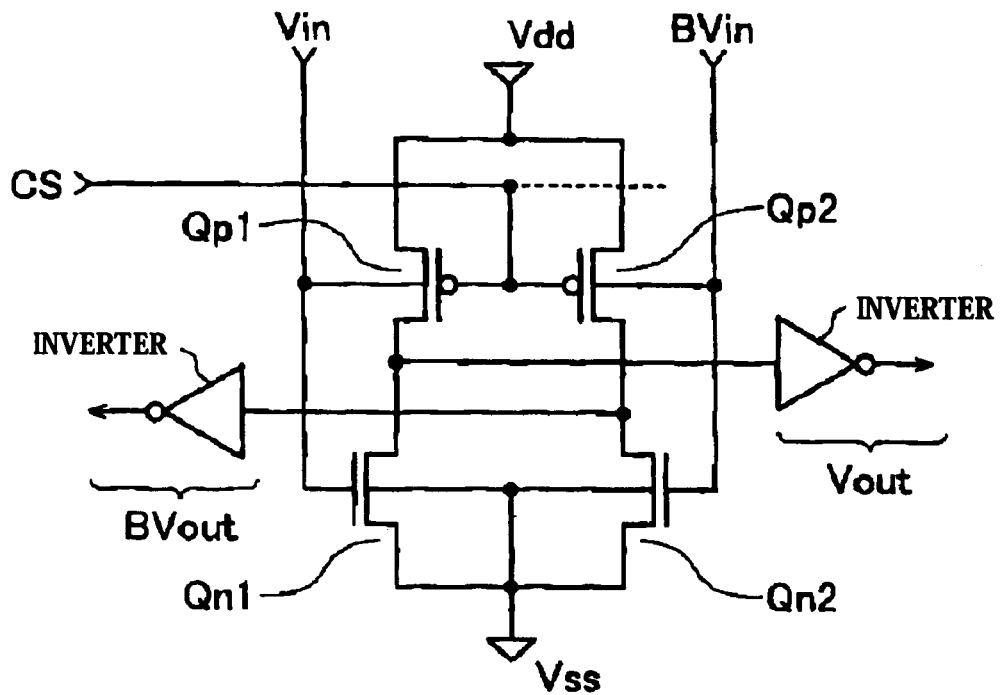
FIG. 1 is a schematic showing a configuration of the principal part of a semiconductor integrated circuit according to a first exemplary embodiment.

FIG. 1 is a schematic showing a configuration of a semiconductor integrated circuit according to a first exemplary embodiment of this invention. In the SOI transistor integrated circuit having a single crystal of silicon formed on an insulating film as a body, p-channel MOS transistors Qp1 and Qp2 and n-channel MOS transistors Qn1 and Qn2 have the following circuit configurations. The p-channel MOS transistors Qp1 and Qp2 are given high potential level Vdd for each source, for example, a power-supply potential. Respective body potentials are variable potentials corresponding to mutually inverse signal inputs Vin and Bvin, and a control signal CS is given to each gate. Also, the n-channel MOS transistors Qn1 and Qn2 are given a low potential level Vss, for example, an earth potential, and the signal inputs Vin and Bvin are respectively supplied to respective gates. At this point, respective sources and bodies of the transistors Qn1 and Qn2 are connected such that they are on the same potential. A connection node between the drains of the p-channel transistor Qp1 and the n-channel MOS transistor Qn1 is connected to a signal output section Vout. Further, a connection node between the drains of the p-channel transistor Qp2 and the n-channel MOS transistor Qn2 is connected to a signal output section BVout.

In the above circuit configuration, when the control signal becomes low level from high level, the transistors Qp1 and Qp2 become activated. N channel MOS transistors Qn1 and Qn2 do not rely on the control signal CS but turns on/off according to the signal input Vin or Bvin level. Sizes of the p-channel MOS transistors Qp1 and Qp2 are made smaller than sizes of the n-channel MOS transistors Qn1 and Qn2. This contributes to reducing current consumption and making an operating speed faster.

In the above circuit configuration, when the signal input Vin is on high level, the signal input Bvin is on low level. The transistor Qn1 turns on and the Qn2 turns off. Respective body potentials of the p-channel MOS transistors Qp1 and Qp2 activated by a low level of the control signal CS become variable with a signal input. The transistor Qp1, wherein the Vin high level is given as the body potential, turns on. But because its size is made small, its current consumption is an equivalent portion. The transistor Qp2, wherein the BVin low level is given as the body potential, is like the transistor Qp1 in that its size is made small. But when the transistor Qn2 is off, it turns on while its capacity is rising, so that a signal output timing is enhanced. An amplification signal of the signal input Vin from a signal output section Vout and an amplification signal of the signal input Bvin from a signal output section Bvout are obtained.

In the above configuration of a first exemplary embodiment, when the n-channel MOS transistor is off in the SOI substrate, it operates so that capacity of the p-channel MOS transistor increases and the signal output speed increases. It is possible to match operating timing at high level and low level outputs. As an inverter circuit, making the body potential of the p-channel MOS transistor a variable potential corresponding to a signal input may lead to anticipation of a wide range of application.

Figure 2:
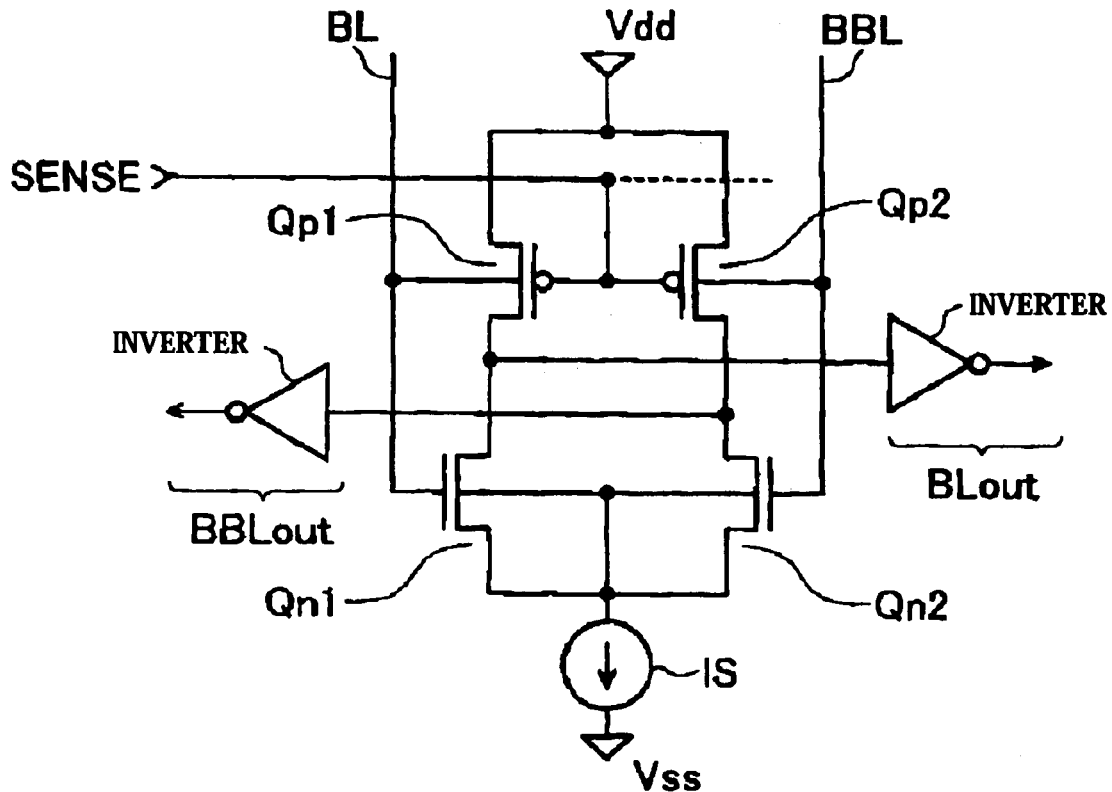
FIG. 2 is a schematic showing a configuration of the principal part of a sense amplifier of a memory according to a second exemplary embodiment.

FIG. 2 is a schematic showing a configuration of the principal part of a sense amplifier of a memory according to a second exemplary embodiment of this invention. SOI (Silicon On Insulator) technology is introduced to the semiconductor memory circuit. Specifically, to provide high integration of a semiconductor memory circuit, a memory cell and various circuits are configured by using an MOS transistor element formed on a SOI substrate. Accordingly, a sense amplifier of the memory is of a configuration shown in the first exemplary embodiment.

In the SOI transistor integrated circuit having a single crystal of silicon formed on the insulating film as its body. The source of the p-channel MOS transistor Qp1 is given a high potential level Vdd, for example, a power-supply potential. A body potential is set as a variable potential corresponding to a signal of a bit line BL, and a control signal SENSE is given to its gate. Also, the source of the n-channel MOS transistor Qn2 is given a high potential level Vdd, for example, a power-supply potential. Its body potential is set at a variable potential corresponding to a signal of a bit line BBL which is a complimentary signal (inverse signal), and a control signal SENSE is given to its gate. The source of the p-channel MOS transistor Qp2 is given a high potential level Vdd, for example, a power-supply potential. Its body potential is set at a variable potential corresponding to a signal of a bit line BBL which is a complimentary signal (inverse signal), and a control signal SENSE is given to its gate. The source of the n-channel MOS transistor Qn1 is given a low potential level Vdd. At this point, an earth potential by way of a constant current source IS, and the signal of the bit line BBL is supplied to the gate. At this point, connection is made such that respective sources and bodies of the transistors Qn1 and Qn2 are on the same potential. The connection node between these drains of the p-channel MOS transistor Qp1 and the n-channel MOS transistor Qn1 is connected to a bit line signal output section Blout. Also, the connection node between these drains of the p-channel MOS transistor Qp2 and the n-channel MOS transistor Qn2 is connected to a bit line complementary signal output section BBlout.

In the above circuit configuration, when a bit line signal output is detected and the control signal SENSE becomes low level from high level, the transistors Qp1 and Qp2 are activated. The n-channel MOS transistors Qn1 and Qn2, not dependent on the control signal SENSE, turn on and off corresponding to the signal level of the bit line BL or the BBL. Now, the sizes of the p-channel MOS transistors Qp1 and Qp2 are smaller than the sizes of the n-channel MOS transistors Qn1 and Qn2. This contributes to reducing current consumption.

In the above circuit configuration, when the bit line BL signal becomes high level, the bit line BBL signal becomes low level. The transistor Qn1 turns on and the Qn2 turns off. Respective body potentials of the p-channel MOS transistors Qp1 and Qp2, which are activated as the control signal SENSE changes from high level to low level, become variable by a bit line signal input. The transistor Qp1, wherein the high level of the bit line BL is given as the body potential, turns on. But because its size is made small, its current consumption is an equivalent portion. The transistor Qp2, wherein the low level of the bit line BBL is given as the body potential, is like the transistor Qp1 in that its size is made small. But when the transistor Qn2 is off, it turns on while its capacity is rising, so that a signal output timing improves.

According to the above configuration of a second exemplary embodiment, when the n-channel MOS transistor is off in the SOI substrate, operation is such that capacity of the p-channel MOS transistor rises and the signal output speed increases. It is possible to match operating timing at the high level and low level outputs. Especially, in regard to the p-channel MOS transistor on the SOI substrate, it is possible to anticipate high speed by selecting a proper transistor size. In the sense amplifier of a memory, the bodies and sources of the n-channel MOS transistors Qn1 and Qn2 are set at the same potential and connected to the constant current supply, thereby contributing to further stability of high speed operation and low power consumption.

As explained above, according to an exemplary aspect of this invention, in a semiconductor integrated circuit having a SOI substrate including a transistor element with a single crystal of silicon formed on an insulating film as a body, there is set up an inverter configuration which treats a body potential of the p-channel MOS transistor as a variable potential corresponding to the signal input. By properly selecting a transistor size, it is possible to anticipate high speed operation, low current consumption, and ease of layout. As a result, a transistor element whose body potential varies is incorporated in an appropriate location, thereby making it possible to provide a semiconductor integrated circuit device and a sense amplifier of a memory which may provide high speed operation with a layout advantage.

What is claimed is:

1. A SOI transistor integrated circuit device having a single crystal of silicon formed on an insulating film as a body, comprising:
    a p-channel MOS transistor, a first potential being supplied to a source of the p-channel MOS transistor, a variable potential corresponding to a signal input being supplied to a body of the p-channel MOS transistor, and a control signal being supplied to a gate of the p-channel MOS transistor;
    an n-channel MOS transistor, a second potential being supplied to a source of the n-channel MOS transistor, and the signal input being supplied to a gate of the n-channel MOS transistor; and
    a signal output section connected to a connection node directly connecting a drain of the p-channel MOS transistor and a drain of the n-channel MOS transistor, the body of the n-channel MOS transistor and the source of the n-channel MOS transistor being set at the same potential.

2. The semiconductor integrated circuit device according to claim 1,
    the gate of the p-channel MOS transistor being supplied with a control signal which turns off the p-channel MOS transistor at standby.

3. The semiconductor integrated circuit device according to claim 1, further comprising:
    the body of the n-channel MOS transistor and the source of the n-channel MOS transistor being connected to a constant current supply.

4. A SOI transistor integrated circuit device, having a single crystal of silicon formed on an insulating film as a body, comprising:
    a first and a second p-channel MOS transistor, a first potential being given to each source, a control signal being given to each gate, and each body potential being set as a variable potential corresponding to a mutually inverse signal input;
    a first and a second n-channel MOS transistor, a second potential being given to each source, and the mutually inverse signal input being supplied to each gate;
    a first signal output section connected to a connection node between drains of the first p-channel MOS transistor and the first n-channel MOS transistor; and
    a second signal output section connected to a connection node between drains of the second p-channel MOS transistor and the second n-channel MOS transistor.

5. The semiconductor integrated circuit device according to claim 4,
    the gates of the first and the second p-channel MOS transistor being supplied with a control signal which turns off the first and the second p-channel MOS transistor at standby.

6. The semiconductor integrated circuit device according to claim 4,
    the bodies of the first and the second n-channel MOS transistor and the sources of the first and the second n-channel MOS transistor being set at the same potential.

7. The semiconductor integrated circuit device according to claim 4, further comprising:
    the bodies of the first and the second n-channel MOS transistor and the sources of the first and the second n-channel MOS transistor being connected to a constant current supply.

8. A sense amplifier of a memory having an SOI substrate including a transistor element having a single crystal of silicon formed on an insulating film as a body, comprising:
    a first p-channel MOS transistor formed on the SOI substrate, the first potential being given to its source, the control signal being given to its gate, and its body potential being set as a variable potential corresponding to a signal of a bit line;
    a second p-channel MOS transistor formed on the SOI substrate, the first potential being given to its source, the control signal being given to its gate, and its body potential being set as a variable potential corresponding to a complementary signal input of the bit line;
    a first n-channel MOS transistor formed on the SOI substrate, a second potential being given to its source, and the bit line signal being supplied to its gate;
    a second n-channel MOS transistor formed on the SOI substrate, a second potential being given to its source, and the bit line complementary signal being supplied to its gate;
    a first signal output section connected to the connection node of the drains of the first p-channel MOS transistor and the first n-channel MOS transistor; and
    a second signal output section connected to the connection node of the drains of the second p-channel MOS transistor and the second n-channel MOS transistor.

9. The sense amplifier of a memory according to claim 8, further comprising:
    a control signal which turns off at standby.

10. The sense amplifier of a memory according to claim 8, further comprising:
    the bodies and sources of the first and the second n-channel MOS transistor being set at the same potential.

11. The sense amplifier of a memory according to claim 8, further comprising:

the bodies and sources of the first and the second n-channel MOS transistor being connected to a constant current supply.

12. The semiconductor integrated circuit device according to claim 1, the first potential being an power-supply potential.

13. The semiconductor integrated circuit device according to claim 1, the second potential being a earth potential.

14. The semiconductor integrated circuit device according to claim 1, the p-channel MOS transistor being smaller than the n-channel MOS transistor.

* * * * *